(12) United States Patent
Hirouchi (10) Patent No.: US 10,474,217 B2
(45) Date of Patent: Nov. 12, 2019

(54) CONTROL APPARATUS, CONTROL METHOD OF CONTROL APPARATUS, AND STORAGE MEDIUM

(71) Applicant: CANON KABUSHIKI KAISHA, Tokyo (JP)

(72) Inventor: Yasuo Hirouchi, Moriya (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 14/996,499

(22) Filed: Jan. 15, 2016

(65) Prior Publication Data
US 2016/0224097 A1    Aug. 4, 2016

(30) Foreign Application Priority Data

Feb. 2, 2015    (JP) .................................. 2015-018337

(51) Int. Cl.
  *G06F 1/32*        (2019.01)
  *G06F 1/3234*      (2019.01)
  (Continued)

(52) U.S. Cl.
  CPC .............. *G06F 1/3275* (2013.01); *G06F 1/24* (2013.01); *G06F 1/3287* (2013.01);
  (Continued)

(58) Field of Classification Search
  CPC .... G06F 1/3275; G06F 7/1072; G06F 1/3287; G06F 1/24; G11C 11/40615;
  (Continued)

(56) References Cited

U.S. PATENT DOCUMENTS 4,839,867 A * 6/1989 Poehnitzsch .......... G11C 11/406
                                                365/194
5,713,006 A * 1/1998 Shigeeda .............. G06F 1/1616
                                                710/8

(Continued)

FOREIGN PATENT DOCUMENTS

JP          1196755 A       4/1999
JP       H11-96755 A       4/1999

(Continued)

OTHER PUBLICATIONS

Office Action dated Apr. 18, 2017 in counterpart Japanese Patent Application No. 2015018337.

(Continued)

*Primary Examiner* — Volvick Derose
(74) *Attorney, Agent, or Firm* — Venable LLP (57) ABSTRACT

A control apparatus for controlling a device having a power-saving mode includes a processing unit, a reset control unit configured to control reset of the processing unit, a power control unit configured to control supply of power to the processing unit, a memory configured to store reset instructions for causing the reset control unit to perform reset of the processing unit and power control instructions for causing the power control unit to cause to stop supply of power to the processing unit, and a memory control unit configured to perform a refresh operation of the memory, and the processing unit acquires the reset instructions and the power control instructions from the memory after performing processing to restrict the memory control unit from performing the refresh operation until the processing unit acquires the reset instructions and the power control instructions from the memory.

10 Claims, 7 Drawing Sheets

(51) Int. Cl.
  *G06F 1/3287*  (2019.01)
  *G11C 11/406*  (2006.01)
  *G06F 1/24*  (2006.01)
  *G06F 1/3203*  (2019.01)
  *G06F 1/3215*  (2019.01)
  *G11C 11/4072*  (2006.01)

(52) U.S. Cl.
  CPC ...... *G11C 11/40615* (2013.01); *G06F 1/3203* (2013.01); *G06F 1/3215* (2013.01); *G11C 11/4072* (2013.01); *G11C 2207/2227* (2013.01); *G11C 2211/4067* (2013.01); *Y02D 10/14* (2018.01); *Y02D 10/171* (2018.01); *Y02D 50/20* (2018.01)

(58) Field of Classification Search
  CPC .............. G11C 40/72; G11C 207/2227; G11C 2211/4067; Y02D 10/171; Y02D 10/14
  USPC ........................................................ 713/323
  See application file for complete search history.

(56) References Cited

U.S. PATENT DOCUMENTS

| | | | | |
|---|---|---|---|---|
| 5,781,782 A * | 7/1998 | Tachikawa | G06F 1/32 | 713/300 |
| 5,933,381 A | 8/1999 | Iwata | | 365/222 |
| 6,226,709 B1 * | 5/2001 | Goodwin | G06F 13/1636 | 711/101 |
| 9,142,280 B1 * | 9/2015 | Pandey | G11C 11/40615 | |
| 2002/0178323 A1 * | 11/2002 | Tsukude | G11C 11/406 | 711/106 |
| 2002/0184438 A1 * | 12/2002 | Usui | G11C 11/406 | 711/106 |
| 2003/0063516 A1 * | 4/2003 | Jain | G11C 8/16 | 365/230.05 |
| 2003/0107938 A1 * | 6/2003 | Jo | G11C 7/20 | 365/222 |
| 2004/0062119 A1 * | 4/2004 | Stimak | G06F 13/1689 | 365/222 |
| 2004/0184335 A1 * | 9/2004 | Afghahi | G11C 11/405 | 365/222 |
| 2005/0091481 A1 * | 4/2005 | Bogin | G06F 1/24 | 713/1 |
| 2005/0138447 A1 * | 6/2005 | Kobayashi | H04N 1/00885 | 713/300 |
| 2005/0157585 A1 * | 7/2005 | Kato | G06F 13/4243 | 365/233.1 |
| 2005/0283572 A1 * | 12/2005 | Ishihara | G06F 1/3203 | 711/118 |
| 2006/0092744 A1 * | 5/2006 | Lee | G11C 5/147 | 365/226 |
| 2007/0162270 A1 * | 7/2007 | Guenther | G06F 17/5027 | 703/22 |
| 2007/0183107 A1 * | 8/2007 | Okada | G03G 15/5004 | 361/62 |
| 2007/0258308 A1 * | 11/2007 | Gilton | G11C 5/005 | 365/222 |
| 2007/0260867 A1 * | 11/2007 | Ethier | G06F 9/4418 | 713/2 |
| 2008/0031588 A1 * | 2/2008 | Leung | H04N 5/76 | 386/239 |
| 2008/0046945 A1 * | 2/2008 | Hanley | H04N 7/17318 | 725/112 |
| 2008/0062798 A1 * | 3/2008 | Kim | G11C 7/20 | 365/222 |
| 2008/0320247 A1 * | 12/2008 | Morfey | G06F 1/24 | 711/154 |
| 2009/0106503 A1 * | 4/2009 | Lee | G11C 7/1075 | 711/149 |
| 2010/0218025 A1 * | 8/2010 | Saito | G06F 1/3203 | 713/324 |
| 2011/0076038 A1 * | 3/2011 | Nakaminato | G03G 15/5004 | 399/37 |
| 2011/0113267 A1 * | 5/2011 | Park | H04N 1/00885 | 713/310 |
| 2011/0219182 A1 * | 9/2011 | Farrell | G11C 11/40611 | 711/106 |
| 2012/0127817 A1 * | 5/2012 | Fujishiro | G11C 11/406 | 365/222 |
| 2012/0140256 A1 * | 6/2012 | Mori | G06F 3/0625 | 358/1.13 |
| 2012/0144106 A1 * | 6/2012 | Bains | G11C 11/40611 | 711/106 |
| 2013/0031388 A1 * | 1/2013 | Sakarda | G06F 1/3287 | 713/320 |
| 2013/0042132 A1 * | 2/2013 | Park | G06F 1/3275 | 713/324 |
| 2013/0124795 A1 * | 5/2013 | Sato | G06F 13/1636 | 711/106 |
| 2013/0132747 A1 * | 5/2013 | Yanagawa | G06F 1/263 | 713/320 |
| 2013/0166926 A1 * | 6/2013 | Yamamizu | G03G 15/5079 | 713/300 |
| 2013/0205153 A1 * | 8/2013 | Yokoyama | G06F 1/3275 | 713/323 |
| 2013/0268747 A1 * | 10/2013 | Chang | G06F 13/14 | 713/2 |
| 2013/0282973 A1 * | 10/2013 | Kim | G11C 11/40622 | 711/106 |
| 2013/0326206 A1 * | 12/2013 | Lueck | G06F 9/4418 | 713/2 |
| 2014/0068166 A1 * | 3/2014 | Fukumura | G06F 13/1668 | 711/104 |
| 2014/0115364 A1 * | 4/2014 | Lewis | G06F 1/32 | 713/323 |
| 2014/0226400 A1 * | 8/2014 | Kimura | G06F 1/3225 | 365/185.08 |
| 2015/0022840 A1 * | 1/2015 | Yamada | G06F 3/1221 | 358/1.13 |
| 2015/0085594 A1 * | 3/2015 | Dong | G11C 11/40626 | 365/222 |
| 2015/0109841 A1 * | 4/2015 | Lim | G11C 16/102 | 365/49.1 |
| 2015/0287461 A1 * | 10/2015 | Song | G11C 11/40615 | 365/185.08 |
| 2015/0319327 A1 | 11/2015 | Hirouchi | | 358/1.13 |
| 2016/0004471 A1 * | 1/2016 | Iketaki | G06F 3/0625 | 711/154 |
| 2016/0085559 A1 * | 3/2016 | Todd | G06F 9/4403 | 713/1 |
| 2016/0155491 A1 * | 6/2016 | Roberts | G11C 11/40607 | 711/106 |
| 2016/0271480 A1 * | 9/2016 | Fukasawa | G09B 19/0038 | |

FOREIGN PATENT DOCUMENTS

| | | | |
|---|---|---|---|
| JP | 5182050 | * | 6/2010 |
| JP | 2010141478 A | | 6/2010 |
| JP | 2012-133454 A | | 7/2012 |
| JP | 2013187590 A | | 9/2013 |
| WO | 2013181220 A1 | | 12/2013 |
| WO | WO 2013/181220 A1 | | 12/2013 |

OTHER PUBLICATIONS

Korean Office Action issued in corresponding Korean Application No. 10-2016-0008450 dated Sep. 28, 2018.

* cited by examiner

CONTROL APPARATUS, CONTROL METHOD OF CONTROL APPARATUS, AND STORAGE MEDIUM

BACKGROUND OF THE INVENTION

Field of the Invention

The present invention relates to a control apparatus of a device having a power-saving mode.

Description of the Related Art

Against the background of an increasing interest in energy saving in recent years, laws relating to power saving of electronic equipment are established. For example, to the image processing apparatus, such as a copying machine and a printer, the International Energy Star Program (image equipment standard), ErP (Energy related Products) regulation Lot6/Lot26, etc., are applied. In ErP regulation Lot26, the power consumption at the time of the network standby state from which electronic equipment can return triggered by remote access to the electronic equipment is regulated. In order to reduce the power consumption in the network standby state, it is considered to stop supply of power to a CPU.

In the case where supply of power to the CPU is stopped to bring about the power source cutoff state, it is necessary to perform power source cutoff control after performing reset control. Here, the reset control means to bring a register of a program counter or the like of the CPU into the initial state (hereinafter, called the reset state) by the CPU performing write access to a reset control module. Further, the power source cutoff control means to bring the CPU into the power source cutoff state by the CPU performing write access to a power source control module. In the case where the CPU enters the power source cutoff state, the main memory in which software that is executed by the CPU is developed also enters the power source cutoff state. Because of this, in the case where the power source cutoff control is performed without bringing the CPU into the reset state, the CPU starts its operation in the state where software that is executed by the CPU after the power source is turned on again is not developed, and therefore, the CPU will malfunction as a result. On the other hand, in the case where the CPU enters the reset state immediately after performing the reset control, the CPU cannot perform register access from then on, and therefore, it is no longer possible to perform the power source cutoff control.

Because of the above, severe restrictions are imposed on the timing of execution of commands of the reset control and the power source cutoff control that are performed by the CPU.

In order to implement the reset control and the power source cutoff control by satisfying the severe restrictions on the timing of the command execution, it is necessary for the CPU to successively fetch (acquire) instructions to perform the reset control and instructions to perform the power source cutoff control from a volatile memory, such as a Double-Data-Rate SDRAM (hereinafter, called a DDR memory) storing programs. Further, the DDR memory or the like is a volatile memory, and therefore, there is a possibility that the data contents will disappear in the case where a stimulus is not applied to the memory for a fixed period of time. In order to avoid the disappearance of data, a memory controller configured to control a volatile memory, such as a DDR memory, includes a mechanism to give instructions to cause the DDR memory to periodically refresh data (replenish charges) (see Japanese Patent Laid-Open No. 2012-133454).

In the case where the volatile memory performs a refresh operation at the time of the CPU fetching the instructions to perform the reset control and the instructions to perform the power source cutoff control from the volatile memory in order to make a transition into the network standby state (=power-saving state) described previously, it is not possible to successively fetch the above-described two instructions.

Consequently, an object of the present invention is to prevent a memory, which performs the refresh operation in order to avoid the disappearance of information, from performing the refresh operation at the timing at which the commands are fetched in the case where the instructions of the reset control and the power source cutoff control are fetched from the memory.

SUMMARY OF THE INVENTION

The control apparatus according to the present invention is a control apparatus for controlling a device having a power-saving mode, and includes a processing unit, a reset control unit configured to control reset of the processing unit, a power control unit configured to control supply of power to the processing unit, a memory configured to store reset instructions to cause the reset control unit to perform the reset of the processing unit, and power control instructions to cause the power control unit to stop the supply of power to the processing unit, and a memory control unit configured to perform a refresh operation of the memory, and the processing unit fetches the reset instructions and the power control instructions from the memory after performing processing to restrict the memory control unit from performing the refresh operation until the processing unit fetches the reset instructions and the power control instructions from the memory.

Further features of the present invention will become apparent from the following description of exemplary embodiments (with reference to the attached drawings).

DESCRIPTION OF THE EMBODIMENTS

Hereinafter, with reference to the attached drawings, the present invention is explained in detail in accordance with preferred embodiments. Configurations shown in the following embodiments are merely exemplary and the present invention is not limited to the configurations shown schematically.

First Embodiment

Figure 1:
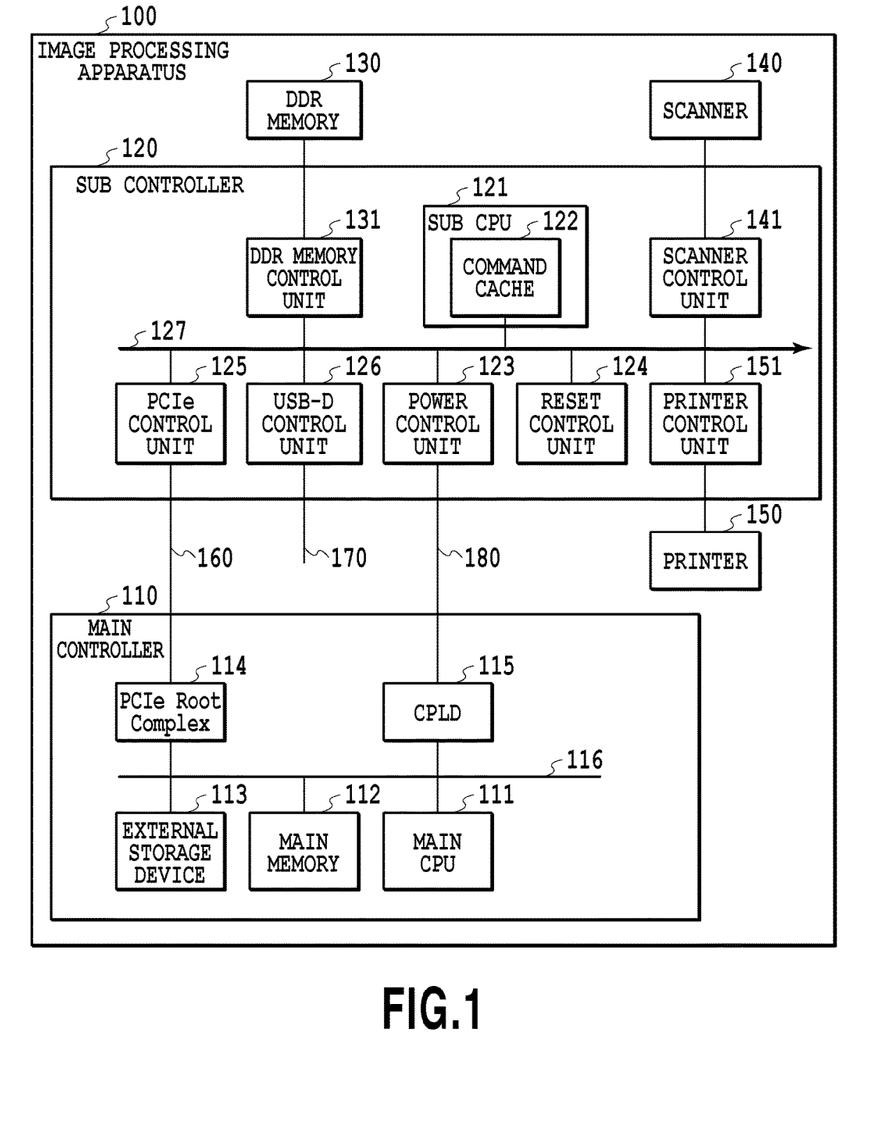
FIG. 1 is a block diagram showing an example of a configuration of an image processing apparatus.

FIG. 1 is a block diagram showing an example of a configuration of an image processing apparatus 100 according to the present embodiment.

The image processing apparatus 100 is divided into a main controller 110 configured to control the entire system and a sub controller 120 to which a printer and a scanner are connected mainly. In the present invention, the control in the sub controller 120 is important, but because of the explanation of a total sequence of the present invention, the relationship between the main controller 110 and the sub controller 120 is also explained.

The main controller 110 internally includes a main CPU 111 controls the entire image processing apparatus 100. A program to control the image processing apparatus 100 is stored in an external storage device 113, such as an HDD, and the program is developed onto a main memory 112 at the time of system operation, and the main CPU 111 executes the program and controls the entire system. A main controller bus 116 connects each block inside the main controller 110, and programs and data flow on the bus, and thereby, communication inside the system is enabled. The main controller 110 has a PCIe Root Complex 114 and connects with the sub controller 120 via a PCIe 160 and performs interactive communication by using the sub controller 120 as a PCIe slave device. It is made possible for the main CPU 111 to directly operate the block inside the sub controller 120, which is mapped into a PCIe space in accordance with the necessity. A Complex Programmable Logic Device (hereinafter, CPLD) 115 detects a variety of signals that occur inside the image processing apparatus 100 and performs control based on a signal that occurs in firmware that belongs to the inside of the CPLD 115. Then, the CPLD 115 in the present embodiment is connected with a power control unit 123, to be described later, via a signal line 180, and is configured to detect a signal that is generated by the power control unit 123. Inside the main controller 110, a plurality of other function units exists besides the above, but explanation of the units not relating to the explanation of the present invention is omitted.

The sub controller 120 includes a sub CPU 121 as a calculation unit, a DDR memory control unit 131, a scanner control unit 141, a printer control unit 151, the power control unit 123, a reset control unit 124, a PCIe control unit 125, and a USB device control unit (hereinafter, USB-D control unit) 126. The sub CPU 121 fetches (acquires) a program code of a DDR memory 130 and controls each module. The sub CPU 121 internally includes a command cache 122 for increasing the speed of processing and a data cache (not shown). The command cache 122 is a portion where a program code that is fetched by the CPU 121 from the DDR memory 130 is stored temporarily. The DDR memory control unit 131 controls access to the DDR memory that is provided outside the sub controller 120. Periodic issuance of a refresh command for avoiding the disappearance of data that is held in the DDR memory 130, which is a volatile memory, is performed by the DDR memory control unit 131. A sub controller bus 127 is a bus for establishing communication between each block within the sub controller 120. The PCIe control unit 125 performs data communication with an external device via the PCIe 160. For example, the sub controller 120 is connected with the PCIe Root Complex 114 via the PCIe 160 as a PCIe EndPoint. After initializing the PCIe control unit 125 and the DDR memory control unit 131, the main CPU 111 transfers a boot program of the sub controller 120 to the DDR memory 130 and releases the reset of the sub CPU 121, and causes the boot program to run. In this manner, the boot of the sub controller 120 is performed. The USB-D control unit 126 performs data communication with an external USB host device via a USB I/F 170. For example, the sub controller 120 is connected with a USB Host (PC or the like), not shown, as a USB device via the USB I/F 170, and stores the received data in the DDR memory 130, and internally performs data processing. The USB-D control unit 126 makes a transition into the standby state of the USB device (hereinafter, USB-D standby state) in response to the instructions from the main CPU 111 and the sub CPU 121. In the USB-D standby state, upon receipt of a predetermined packet from the USB I/F 170, the USB-D control unit 126 transmits a response packet for the predetermined packet to an external device via the USB I/F 170. At the same time, the USB-D control unit 126 notifies the CPLD 115 of a standby state release signal via the power control unit 123. The CPLD 115 having received the notification performs standby state release processing also on the sub controller 120 as well as performing the standby state release processing on the main controller 110. The reset control unit 124 performs the reset control of the DDR memory control unit 131, the sub CPU 121, the PCIe control unit 125, and the USB-D control unit 126 in response to the instructions from the sub CPU 121. The scanner control unit 141 performs reception control of data from the scanner 140 in response to a request from the sub CPU 121. The printer control unit 151 performs transmission control of data to the printer 150 in response to a request from the sub CPU 121.

Figure 2:
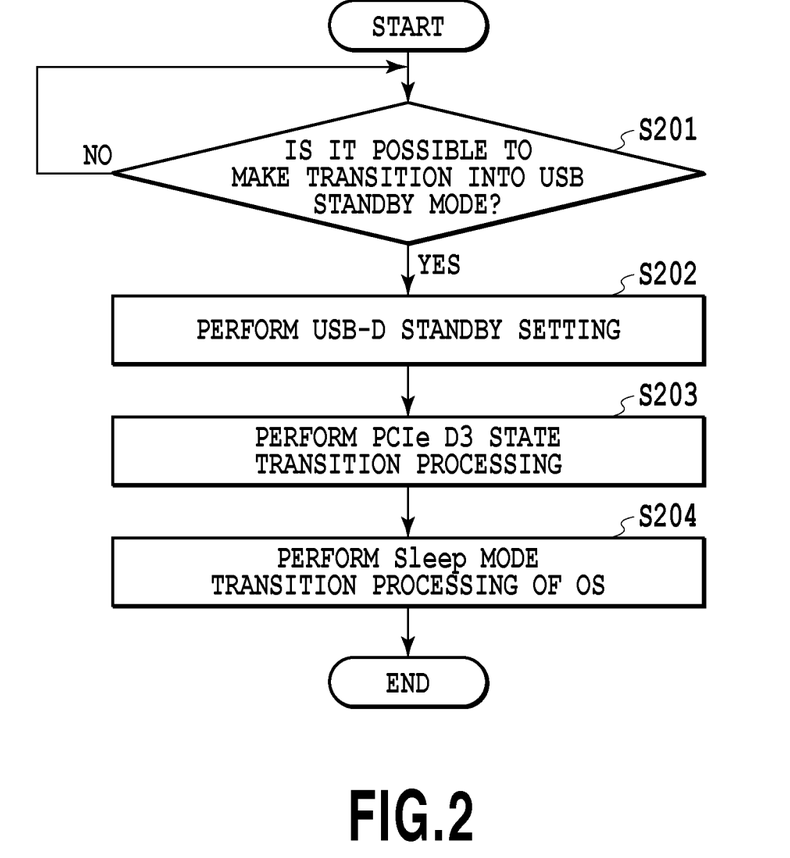
FIG. 2 is a flowchart of a sequence that is performed by a main CPU on a main controller.
Figure 3:
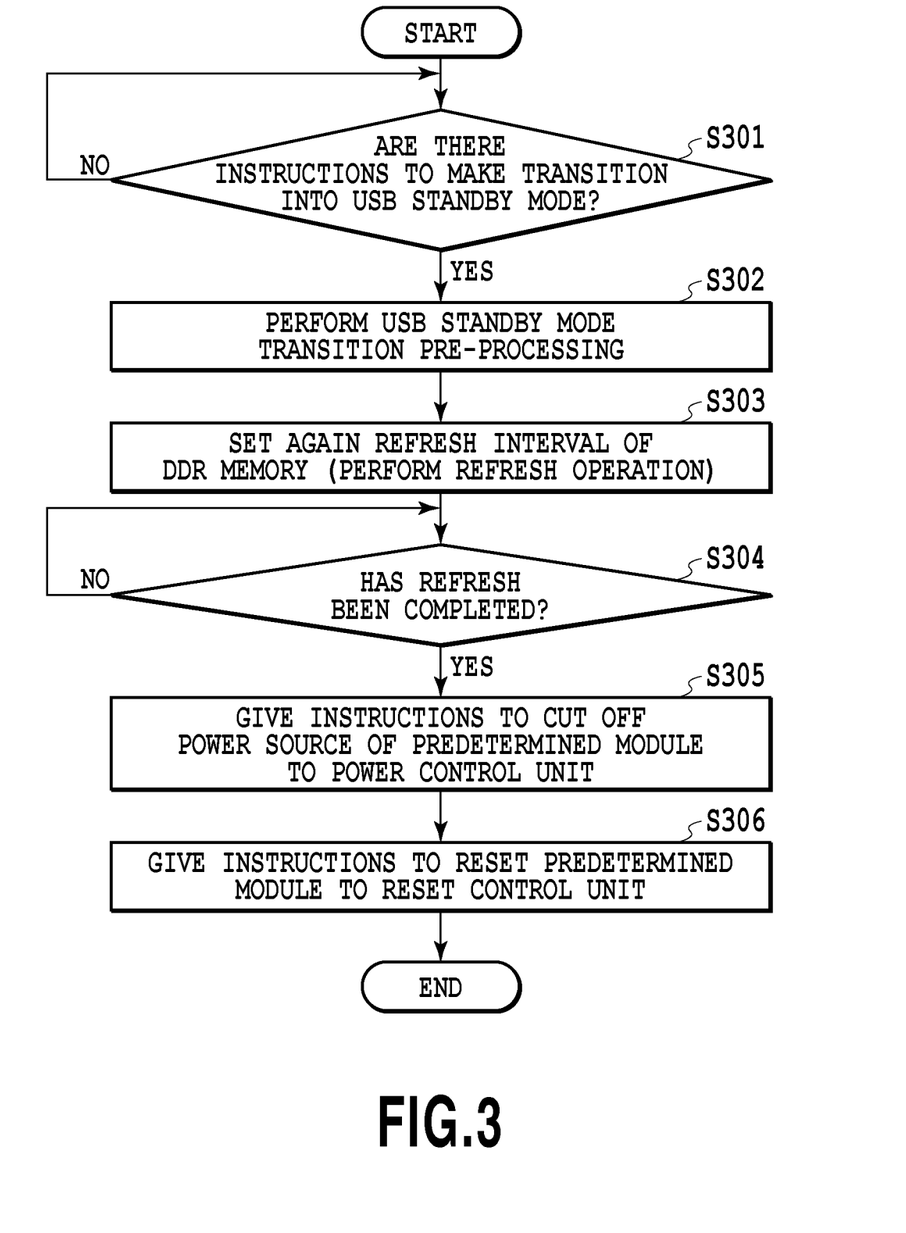
FIG. 3 is a flowchart of a sequence that is performed by a sub CPU on a sub controller.

FIG. 2 and FIG. 3 are each a flowchart showing a transition processing sequence into a USB standby mode as a power-saving mode, which is the feature of the present invention. FIG. 2 is a flowchart of a sequence that is performed by the main CPU 111 on the main controller 110 and FIG. 3 is a flowchart of a sequence that is performed by the sub CPU 121 on the sub controller 120.

First, the sequence in the main controller 110 is explained.

At step 201, the main CPU 111 determines whether the image processing apparatus 100 can make a transition into the USB standby mode. Specifically, for example, whether the conditions below are satisfied is determined.

There is no request of an external JOB via the USB device for a fixed period of time There is no request of an external JOB via the Ethernet (registered trademark) for a fixed period of time The time of transition into the power-saving mode (USB standby mode) that is set in advance is reached For the above-described time of transition into the power-saving mode, an arbitrary time is set by a user, for example, in a range of several minutes to several hours.

In the case where the results of the determination indicate that the above-described predetermined conditions to make a transition into the USB standby mode are satisfied, the processing proceeds to step 202. On the other hand, in the case where the above-described predetermined conditions are not satisfied, monitoring is continued and the determination is repeated periodically.

At step 202, the main CPU 111 performs a setting at the time of standby for the USB-D control unit 126. Specifically, in the case where a setting of a register of the USB-D control unit 126 is changed and a packet is received from the external USB host device during the USB standby mode, a setting to change the NAK response is performed. At the same time, a setting to issue a signal for notifying the CPLD 115 via the power control unit 123 of the reception of a package from the external USB host device is performed.

At step 203, the main CPU 111 performs D3 state transition processing, which means the power-saving state, on the PCIe control unit 125 of the sub controller 120 via the PCIe Root Complex 114.

At step 204, the main CPU 111 performs Sleep mode transition processing of an operating system that runs on the main controller 110. Specifically, in a system or the like that uses a file system, the main CPU 111 performs the File Sync operation and Suspend processing of each register.

By the above, USB standby mode transition processing on the main controller 110 is completed.

Subsequently, the sequence in the sub controller 120 is explained. Here, it is necessary to take into consideration an access penalty in the case where a cache miss occurs in the command cache 122 or where the refresh is in operation at the time of the occurrence of a program fetch in the DDR memory 130. In the present embodiment, by setting again the refresh interval (time interval from when the refresh operation is performed until the refresh operation is performed again) of the volatile memory, the problem of the above-described access penalty is prevented from surfacing. In the following, detailed explanation is given.

At step 301, the sub CPU 121 determines presence/absence of instructions to make a transition into the USB standby mode from the main controller 110. The transition instructions occur after the main controller 110 performs the above-described D3 state transition processing (step 203). In the case where the results of the determination indicate that there are transition instructions from the main controller 110, the processing proceeds to step 302. On the other hand, in the case where there are not transition instructions, the monitoring is continued and the determination is performed periodically.

At step 302, the sub CPU 121 performs USB standby mode transition pre-processing. Specifically, the sub CPU 121 sets the register that exists on the sub controller 120 to one for the USB standby mode. Details of the setting contents do not relate to the feature of the present invention, and therefore, explanation is omitted.

At step 303, the sub CPU 121 resets the refresh interval of the DDR memory 130. Specifically, by the operation of the register of the DDR memory control unit 131, the refresh interval is set again to, for example, 7.8 μs. By resetting the refresh interval, the DDR memory control unit 131 causes the DDR memory 130 to make a transition into the refresh operation state. In other words, even in the case where the refresh has been completed immediately before the transition, the refresh operation for the DDR memory 130 is performed again at the timing at which the refresh interval is set again. Due to this, an attempt is made to minimize the access latency both in the reset control command and in the power source cutoff control command.

At step 304, the sub CPU 121 determines whether the refresh of the DDR memory 130 has been completed. As a determination method, for example, it may also be possible to wait until a predetermined time (e.g., 5 to 10 ns), which is expected for the refresh operation, to elapse, or in the case of the DDR memory control unit 131 having a function to detect the completion of the refresh of the DDR memory 130, it may also be possible to determine that the refresh has been completed by detecting the completion of the refresh.

At step 305, the sub CPU 121 gives instructions to cut off the power source of a predetermined module to the power control unit 123. Specifically, by the operation of the register of the power control unit 123, the power source stop processing is started for each module other than the USB-D control unit 126, the power control unit 123, and the reset control unit 124 on the sub controller 120.

At step 306, the sub CPU 121 gives instructions to reset a predetermined module to the reset control unit 124. Specifically, by the operation of the register of the reset control unit 124, the reset processing of the sub CPU 121 itself is started.

By the above, USB standby mode transition processing on the sub controller 120 is completed.

Figure 4:
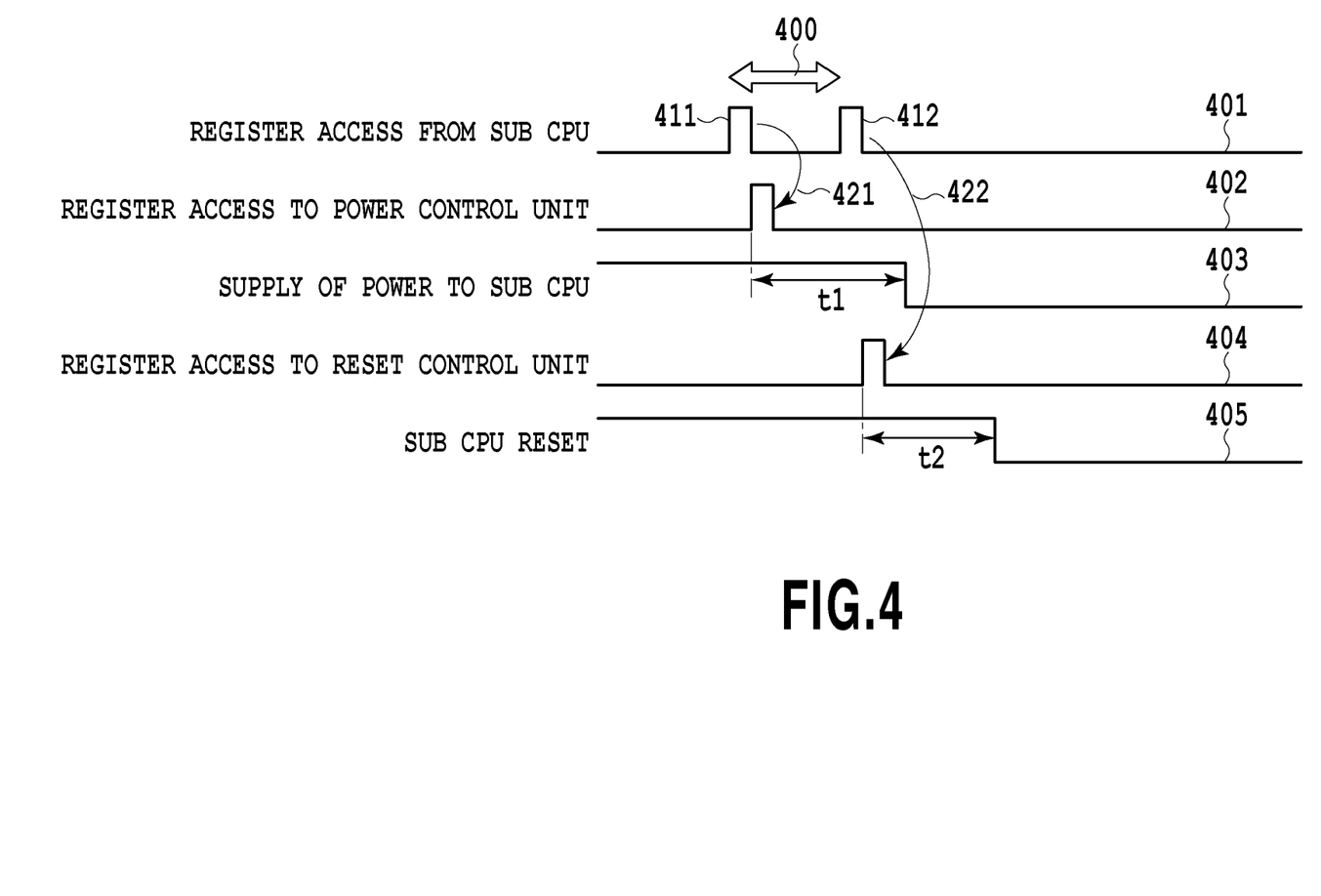
FIG. 4 is a timing chart of internal processing in the sub controller.

Subsequently, the timing of the internal processing in the sub controller 120 in the case where the transition processing into the USB standby mode is performed is explained. FIG. 4 is a timing chart of the internal processing in the sub controller 120.

In FIG. 4, a chart 401 indicates issuance timing of register access for the power control unit 123 and the reset control unit 124 of the timing of register access that is issued from the sub CPU 121 to each control module via the sub controller bus 127. In the chart 401, a first pulse 411 is the issuance timing of the register access for the power control unit 123, and a second pulse 412 is the issuance timing of the register access for the reset control unit 124. A chart 402 indicates timing at which the register of the power control unit 123 is actually accessed. A chart 403 indicates the state of supply of power from the power control unit 123 to the sub CPU 121, and the point in time at which High falls to Low indicates the point in time at which the supply of power is stopped. A chart 404 indicates timing at which the register of the reset control unit 124 is actually accessed. A chart 405 indicates the state of a reset signal that is applied from the reset control unit 124 to the sub CPU 121 and the point in time at which High falls to Low indicates the timing at which the sub CPU 121 has entered the reset state. Then, in FIG. 4, an arrow 421 corresponds to the processing at step 305 described previously, and an arrow 422 corresponds to the processing at step 306 described previously. In other words, the arrow 421 indicates the timing of the register access from the sub CPU 121 to the power control unit 123 and the arrow 422 indicates the timing of the register access from the sub CPU 121 to the reset control unit 124. Then, t1 indicates a time from the register access to the power control unit 123 until the supply of power to the sub CPU 121 is stopped after a predetermined delay. Then, t2 indicates a time from the register access to the reset control unit 124 until the sub CPU 121 is reset after a predetermined delay. The above-described predetermined delay (=access latency) varies depending on various conditions, such as the clock frequency of the sub CPU 121, and for example, has a value of several ten to hundred and several ten ns.

Figure 5:
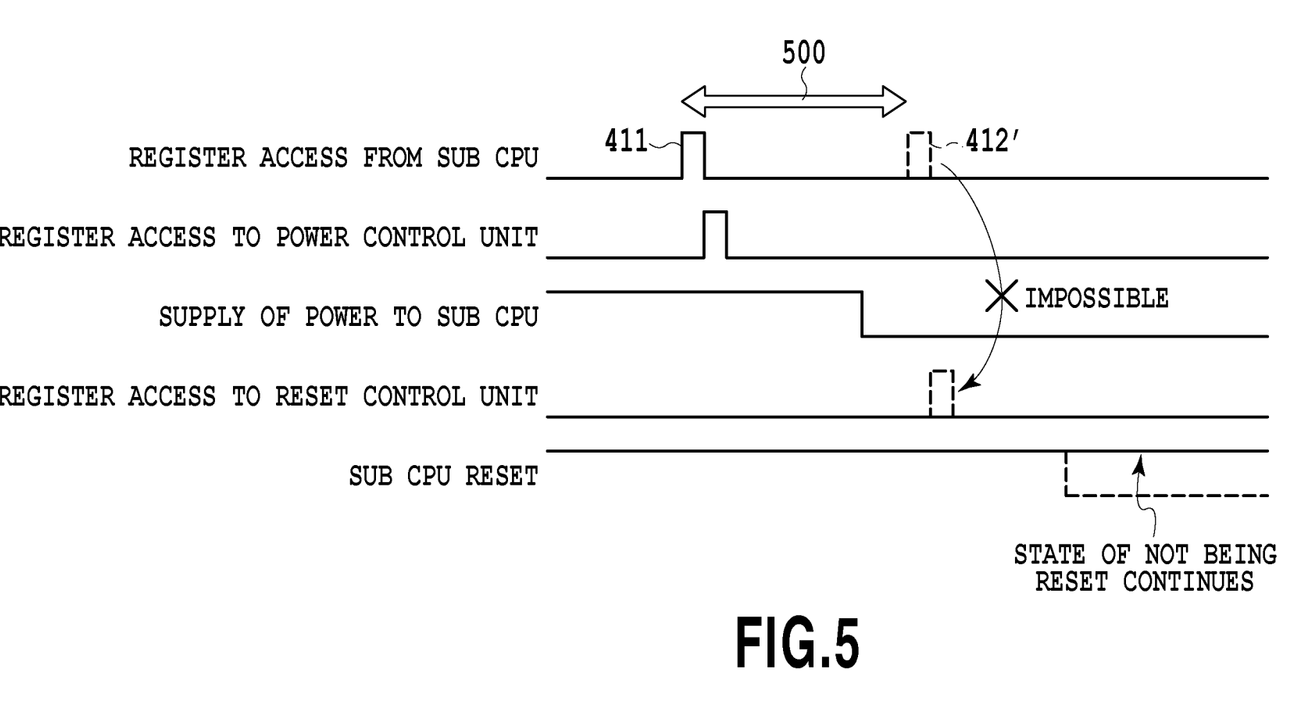
FIG. 5 is a timing chart of the internal processing in the case where processing to issue register access from the sub CPU cannot be performed by the timing at which supply of power to the sub CPU is stopped.

As is obvious from FIG. 4, in the case where the register access for the power control unit 123 is performed (charts 402 and 404), after the predetermined delay described above, the operation of the sub CPU 121 stops as a result. In other words, in the case where the supply of power to the sub CPU 121 is stopped due to the register access for the power control unit 123, it is no longer possible to issue register access from the sub CPU 121 to each module from then on. As a result of this, the register access from the sub CPU 121 to the reset control unit 124 is also disabled, and it is no longer possible to reset the sub CPU 121. In other words, in order to make a normal transition into the USB standby mode, it is necessary to perform the processing to issue the register access from the sub CPU 121 before the timing at which the supply of power to the sub CPU 121 is stopped. FIG. 5 shows a timing chart of the internal processing in the case where it is not possible to perform the processing to issue the register access from the sub CPU 121 (in more detail, the processing to issue the register access to the reset control unit 124) before the timing at which the supply of power to the sub CPU 121 is stopped. In FIG. 5, the interval (bidirectional arrow 500) from the pulse 411 indicating the issuance timing of the register access to the power control unit 123 to a pulse 412' indicating the issuance timing of the register access to the reset control unit 124 is wider compared to the interval shown by a bidirectional arrow 400 in FIG. 4. In the case in FIG. 5, the timing (point in time of fall) at which the supply of power to the sub CPU 121 is stopped is ahead of the timing (pulse 412') of the processing to issue the register access to the reset control unit 124, and therefore, in fact, it is not possible to issue the register access at the timing of the pulse 412'. Consequently, it is no longer possible to reset the sub CPU 121 by the reset control unit 124 at the timing shown by the pulse 412'. The portion indicated by a broken line in FIG. 5 indicates that it is not possible to actually reset the sub CPU 121 (to implement reset).

Here, as the factors that cause the interval of the issuance of the register access from the sub CPU 121 to the control module to increase as shown in FIG. 5, the following can be thought as candidates. One of them is the occurrence of a cache miss in the sub CPU 121 during the period of time between the execution of a command relating to the processing at step 305 and the execution of a command relating to the processing at step 306 in the flow in FIG. 3, which causes a cache refill from the DDR memory 130 to occur. In the case where a cache refill occurs, a penalty of, normally, one to several ns occurs as a result (until the cash refill is completed, it is not possible for the sub CPU 121 to execute the next program) due to a refill of the command from the DDR memory 130. Then, in the case where refresh for the DDR memory 130 is issued immediately before the memory access for a refill, the penalty is further lengthened as a result. In other words, the sub CPU 121 is made to wait for the time corresponding to "time (five to ten ns) of the refresh operation of the DDR memory 130+time (one to several ns) of the cache refill operation", and therefore, there may be a possibility that an increase in the interval as shown by the bidirectional arrow 500 in FIG. 5 will occur. In this state, the timing of the issuance processing of the register access to the reset control unit 124 becomes the timing as shown by the pulse 412', and as a result, a situation in which it is no longer possible to make a normal transition into the USB standby mode may occur.

Consequently, in the present embodiment, by performing the processing to set again the refresh interval of the DDR memory 130 (step 303 in the flow in FIG. 3), the situation in which the DDR memory 130 is in the refresh operation state at the time of a cache refill is avoided from occurring. This focuses on the fact that in the case where refresh has been performed once, the refresh operation is not performed for a predetermined period of time. In other words, by completing the refresh of the DDR memory 130 at the timing immediately close to the execution of the two subsequent commands by resetting (setting again) the refresh interval, the occurrence of penalty in which the access is stopped during the refresh of the DDR memory 130 is suppressed. In this manner, a fixed time (time required for the processing at step 305 and at step 306 in the flow in FIG. 3. For example, 10 to 20 ns) required for the register access indispensable to the transition into the USB standby mode is secured.

Compared to the influence of the penalty in which the command is refilled from the DDR memory 130, the influence of the penalty in which the access is stopped during the refresh of the DDR memory is by far large, and therefore, the cash refill is not dealt with in particular in the present embodiment. Even in the case where a cash refill occurs, on a condition that the refresh of the DDR memory 130 has not occurred, the above-described problem will not occur, and therefore, it is possible to sufficiently solve the problem of the present application by the method of the present embodiment.

As above, in the present embodiment, control is performed so that the refresh operation of the DDR memory 130 is performed prior to the instructions to cut off the power source of a predetermined module to the power control unit 123 and the instructions to reset a predetermined module to the reset control unit 124 from the sub CPU 121. Due to this, the normal mode transition is guaranteed by making it possible to issue the register access that is necessary for the transition into the USB standby mode while the sub CPU 121 can operate.

Figure 6:
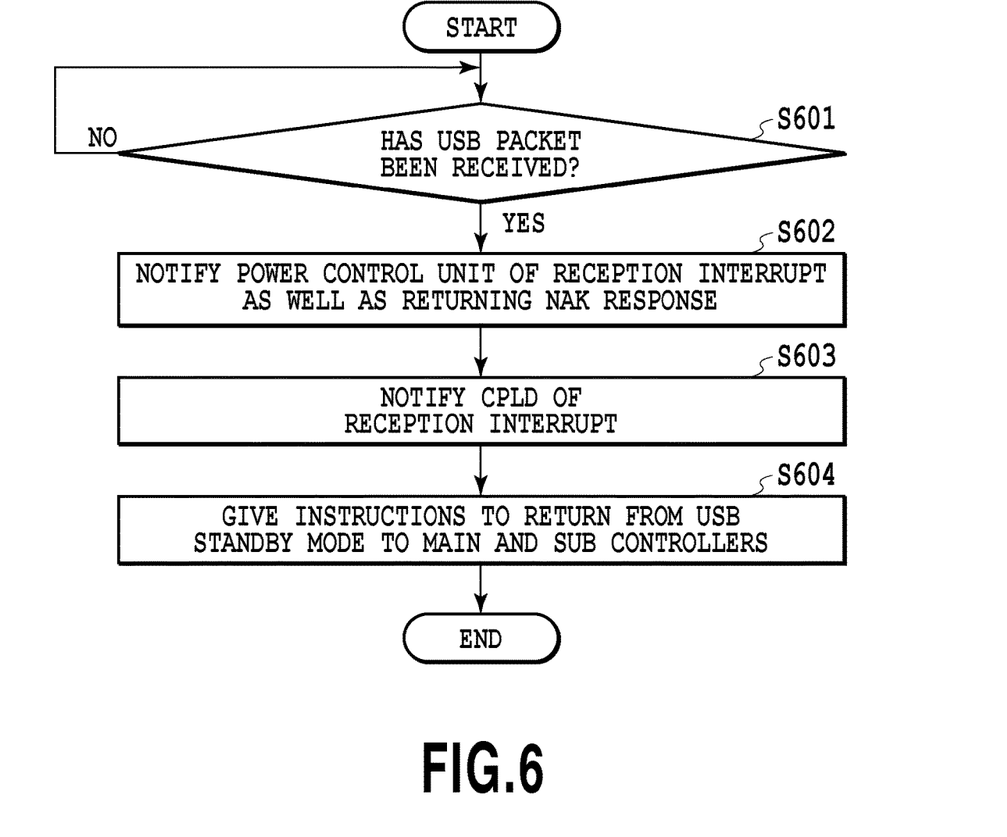
FIG. 6 is a flowchart showing a flow of an operation in terms of hardware in a USB-D control unit and a power control unit of the sub controller, and in a CPLD of the main controller.
Figure 7:
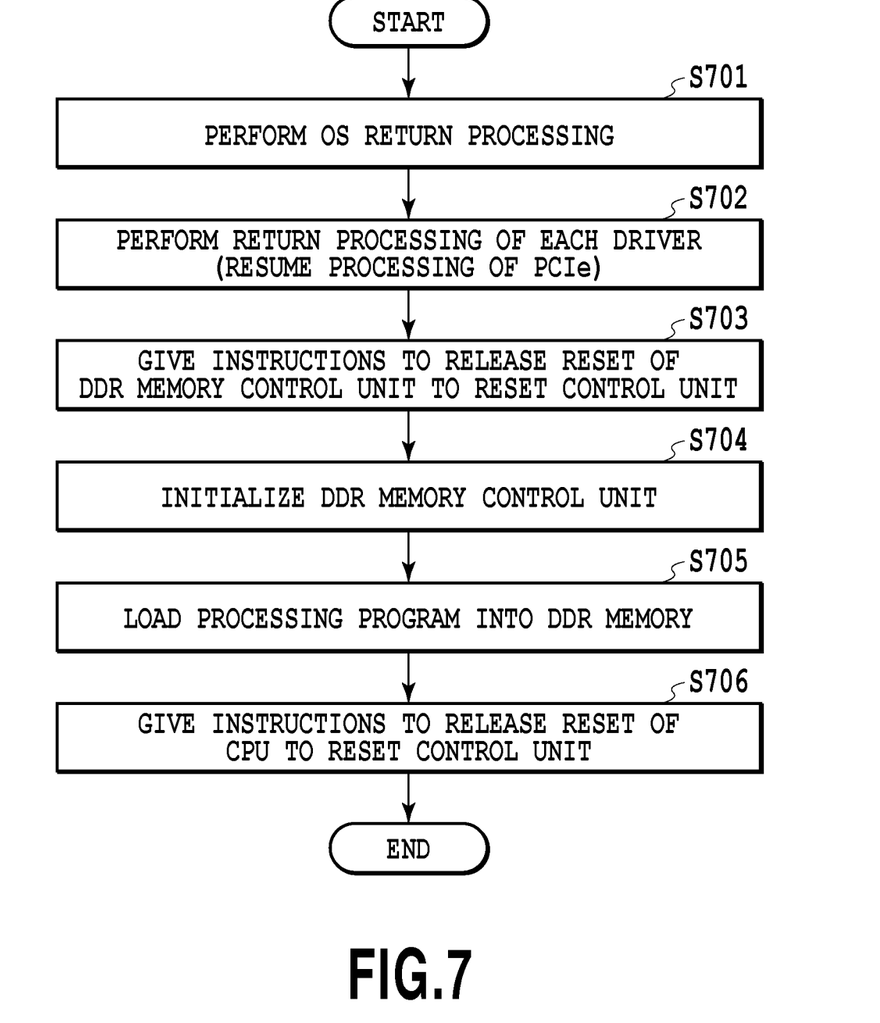
FIG. 7 is a flowchart showing a software sequence that is processed by the main CPU of the main controller.

FIG. 6 and FIG. 7 are each a flowchart showing a sequence of the processing to return from the USB standby mode. FIG. 6 is a flowchart showing a flow of the operation in terms of hardware in the USB-D control unit 126 and the power control unit 123 of the sub controller 120 and in the CPLD 115 of the main controller 110. FIG. 7 is a flowchart showing a software sequence that is processed by the main CPU 111 of the main controller 110.

First, along the flowchart in FIG. 6, the flow of the operation in terms of hardware is explained. The operation mode of the image processing apparatus 100 having completed the sequences shown in FIG. 2 and FIG. 3 described previously is the USB standby mode. Because of this, the USB-D control unit 126 is in the state of monitoring the presence/absence of a packet input from the USB host device.

At step 601, the USB-D control unit 126 of the sub controller 120 determines whether a packet has been received from the USB host device. In the case where a packet has been received, the processing proceeds to step 602. On the other hand, in the case where no packet has been received, the monitoring of a packet input is continued.

At step 602, the USB-D control unit 126 of the sub controller 120 returns an NAK response to the USB host device and at the same time, notifies the power control unit 123 of the packet reception interrupt.

At step 603, the power control unit 123 of the sub controller 120 notifies the CPLD 115 of the main controller 110 of the acquisition of the reception interrupt notification from the USB-D control unit 126.

Upon receipt of the notification from the power control unit 123, at step 604, the CPLD 115 of the main controller 110 gives instructions to return from the USB standby mode (instructions to perform the processing to turn on the power source) to the main controller 110 and the sub controller 120.

The above is the flow of the operation in terms of hardware in the case where the image processing apparatus 100 returns from the USB standby mode.

Subsequently, the software sequence that is processed by the main CPU 111 of the main controller 110 is explained.

Upon receipt of the instructions to return from the USB standby mode from the CPLD 115, at step 701, the main CPU 111 starts OS resume processing (return processing to resume a task from the state at the point in time at which the supply of power is stopped).

At step 702, the main CPU 111 performs processing to return each driver. Specifically, resume processing relating to the PCIe, resume processing relating to the USB device, etc., are performed. By the completion of the resume processing of the PCIe, a PCIe link is established and it is made possible for the main CPU 111 to control the sub controller 110 as a PCIe device. Further, by the completion of the resume processing of the USB device, it is made possible for the main CPU 111 to control the USB-D control unit 126, and therefore, it is made possible to process a packet received from the USB host device. Specifically, the NAK response setting at step 602 described previously is released and data reception is resumed.

At step 703, the main CPU 111 gives instructions to release the reset of the DDR memory control unit 131 to the reset control unit 124.

At step 704, the main CPU 111 initializes the DDR memory control unit 131. By this initialization processing, it is made possible for the main CPU 111 to access the DDR memory 130.

At step 705, the main CPU 111 loads the processing program of the sub controller 110 into the DDR memory 130. Due to this, the main CPU 111 releases the reset of the sub CPU 121 by controlling the register of the reset control unit 124. By this reset release processing, it is made possible for the sub controller 110 to start the operation under the control of the sub CPU 121.

The above is the contents of the software sequence that is processed by the main CPU 111 at the time of returning from the USB standby mode. By the above-described processing, the sub controller 110 returns from the USB standby mode and at the same time, together with the main controller 110, the image processing apparatus 100 returns from the USB standby mode (i.e., transition into the normal power mode is made).

Modification Example 1

In the present embodiment, control is performed so that the refresh processing is performed at the timing immediately before the instructions to cut off the power source to the power control unit and the instructions to perform reset to the reset control unit from the CPU by setting again the refresh interval for the volatile memory. In place of this, it may also be possible to design a configuration in which the memory control unit that controls the volatile memory explicitly induces the refresh operation of the volatile memory. In other words, in the case of the memory control unit having the function to explicitly induce the refresh operation of the volatile memory, it may also be possible to directly start the refresh operation by the sub CPU 121 operating the register of the DDR memory control unit 131 and to cause the DDR memory 130 to make a transition into the refresh state. By such a method also, it is possible to obtain the same effects.

Modification Example 2

It may also be possible to secure the necessary time by the memory control unit explicitly prohibiting the refresh operation of the volatile memory, instead of performing the refresh processing immediately before the instructions to cut off power source to the power control unit and the instructions to perform reset to the reset control unit from the CPU. In other words, it may also be possible to secure a fixed time (e.g., to 20 ns) that is necessary for the register access indispensable to the above-described transition into the USB standby mode by preventing the DDR memory 130 from entering the refresh state by the sub CPU 121 operating the register of the DDR memory control unit 131. The instructions to explicitly prohibit refresh in this case are cleared by the initialization of the DDR memory control unit 131 (step 704 in the flow in FIG. 7) in the return processing that is processed by the main CPU 111 of the main controller 110, and after the normal power mode returns, the refresh operation is performed at the predetermined refresh interval without any problem.

Modification Example 3

It may also be possible to design a configuration in which whether there is a sufficient time before the next refresh is determined and in the case where a time that is necessary for the register access indispensable to the transition into the USB standby mode is left, the processing proceeds to the next processing, in place of setting again the refresh interval or giving the instructions to explicitly perform the refresh operation. Specifically, the sub CPU 121 performs the processing to determine whether a time longer than the time (e.g., 10 to 20 ns) that is necessary for the register access indispensable to the above-described transition into the USB standby mode is left before the start of the next refresh operation. Only in the case where the results of the determination indicate that a time longer than the time that is necessary for the register access indispensable to the transition into the USB standby mode is left, the processing may proceed to the instructions to cut off power source to the power control unit 123 and the instructions to perform reset to the reset control unit 124 (processing at step 305 and step 306 in the flow in FIG. 3).

As above, according to the present embodiment, in the case where commands of reset control and power source cutoff control are fetched from a volatile memory that requires a refresh operation, control is performed so that the refresh for the above-described volatile memory does not occur at the timing at which the commands are fetched. As a result of this, it is possible to securely issue register access from the CPU, which is necessary for the transition into a power-saving mode.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to the present invention, in the case where commands of reset control and power source cutoff control are fetched from a memory that prevents information from disappearing by performing a refresh operation, it is possible to prevent the memory from performing the refresh operation at the timing at which the commands are fetched.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-018337, filed Feb. 2, 2015 which is hereby incorporated by reference wherein in its entirety.

What is claimed is:

1. An apparatus having a power-saving mode, the apparatus comprising:
    a processor;
    a reset control circuit that resets the processor;
    a power control circuit that controls supply of power to the processor;
    a DRAM (Dynamic Random Access Memory) that stores a reset instruction for causing the reset control circuit to perform reset of the processor and a power control instruction for causing the power control circuit to stop supply of power to the processor; and
    a memory controller that performs control so as to cause the DRAM to perform a self-refresh operation, wherein the processor fetches the reset instruction from the DRAM and fetches the power control instruction from the DRAM, and wherein,
    after a predetermined condition to shift a power mode of the apparatus into the power saving mode is satisfied before supply of power to the processor is stopped, the memory controller performs control so as to cause the DRAM to perform the self-refresh operation, then the processor sets the reset control circuit to reset the processor in accordance with the reset instruction fetched from the DRAM and the processor sets the power control circuit to stop supply of power to the processor in accordance with the power control instruction fetched from the DRAM.

2. The apparatus according to claim 1, wherein the memory control unit performs control so as to cause the DRAM to forcibly perform the self-refresh operation when the predetermined condition is satisfied.

3. The apparatus according to claim 1, wherein the memory control unit resets a time interval of performing the self-refresh operation when the predetermined condition is satisfied.

4. The apparatus according to claim 1, wherein the processor
    determines whether the self-refresh operation has been completed; and,
    after the processor determines that the self-refresh operation has been completed,
        sets the reset control circuit to reset the processor in accordance with the reset instruction fetched from the DRAM; and
        sets the power control circuit to stop supply of power to the processor in accordance with the power control instruction fetched from the DRAM.

5. The apparatus according to claim 1, wherein the processor
    determines whether or not a remaining time before a next self-refresh operation is to be performed is equal to or more than a predetermined time; and,
    in a case where the processor determines that a remaining time before the next self-refresh operation is to be performed is not equal to or more than the predetermined time, controls the memory control unit so as to cause the DRAM to perform the self-refresh operation.

6. The apparatus according to claim 1, further comprising a USB control circuit that communicates with a USB host, wherein,
    the power control circuit controls supply of power to the USB control circuit.

7. The apparatus according to claim 6, further comprising a controller that includes one or more processors and one or more memories,
    wherein
    the USB control circuit outputs an interrupt signal to the power control circuit based on a packet from the USB host, and the power control circuit notifies the controller based on the interrupt signal, and
    the controller controls the reset control circuit to reset the processor and controls the power control circuit to control supply of power to the processor.

8. The apparatus according to claim 1, further comprising a printing unit.

9. A method of controlling an apparatus having a processor, a DRAM (Dynamic Random Access Memory), a reset control circuit that resets the processor, and a power control circuit that controls supply of power to the processor, and which is able to shift into a power-saving mode, the method comprising:
    a first fetching step, by the processor, to fetch from the DRAM a reset instruction for causing the reset control circuit to perform reset of the processor;
    a first giving step to give an instruction to cause the reset control circuit to reset the processor in accordance with the reset instruction fetched from the DRAM;
    a second fetching step, by the processor, to fetch from the DRAM a power control instruction for causing the power control circuit to stop supply of power to the processor; and
    a second giving step to give an instruction to cause the power control circuit to stop supply of power to the processor in accordance with the power control instruction fetched from the DRAM, wherein,
    after a predetermined condition to shift a power mode of the apparatus into the power saving mode is satisfied before supply of power to the processor is stopped, performing a memory control step to cause the DRAM to perform a self-refresh operation, then the first fetching step, the first giving step, the second fetching step, and the second giving step are performed.

10. A non-transitory computer-readable medium storing a program for causing a computer to perform a method of controlling an apparatus having a processor, a DRAM (Dynamic Random Access Memory), a reset control circuit that resets the processor, and a power control circuit that controls supply of power to the processor, and which is able to shift into a power-saving mode, the method comprising:
    a first fetching step, by the processor, to fetch from the DRAM a reset instruction for causing the reset control circuit to perform reset of the processor;

a first giving step to give an instruction to cause the reset control circuit to reset the processor in accordance with the reset instruction fetched from the DRAM;

a second fetching step, by the processor, to fetch from the DRAM a power control instruction for causing the power control circuit to stop supply of power to the processor; and a second giving step to give an instruction to cause the power control circuit to stop supply of power to the processor in accordance with the power control instruction fetched from the DRAM, wherein, after a predetermined condition to shift a power mode of the apparatus into the power saving mode is satisfied before supply of power to the processor is stopped, performing a memory control step to cause the DRAM to perform a self-refresh operation, then the first fetching step, the first giving step, the second fetching step, and the second giving step are performed.

* * * * *